United States Patent [19]

Lehmann

[11] 3,975,754

[45] Aug. 17, 1976

[54] POWER THYRISTOR HAVING A HIGH TRIGGERING SPEED

[75] Inventor: Serge Lehmann, Ste. Genevieve des Bois, France

[73] Assignee: Societe Generale de Constructions Electriques et Mecaniques (ALSTHOM), Paris Cedex, France

[22] Filed: Dec. 12, 1974

[21] Appl. No.: 532,101

[30] Foreign Application Priority Data

Dec. 12, 1973  France .................. 73.44330

[52] U.S. Cl. .................. 357/38; 357/20; 357/68; 357/86
[51] Int. Cl.² ....................... H01L 29/74
[58] Field of Search .............. 357/20, 38, 39, 86, 357/68

[56] References Cited
UNITED STATES PATENTS

| | | | |
|---|---|---|---|
| 3,486,088 | 12/1969 | Gray et al. | 357/38 |
| 3,577,046 | 5/1971 | Moyson | 357/38 |
| 3,586,927 | 6/1971 | Roach et al. | 357/38 |
| 3,590,346 | 6/1971 | Bilo et al. | 357/38 |
| 3,725,753 | 4/1973 | Garrett | 357/38 |
| 3,740,584 | 6/1973 | McIntyre et al. | 357/38 |
| 3,832,732 | 8/1974 | Roberts | 357/38 |
| 3,914,781 | 10/1975 | Matsushita et al. | 357/38 |

FOREIGN PATENTS OR APPLICATIONS

| | | | |
|---|---|---|---|
| 2,077,332 | 10/1971 | France | 357/38 |
| 2,164,901 | 8/1973 | France | 357/38 |
| 2,056,806 | 5/1972 | Germany | 357/38 |
| 6,613,255 | 3/1967 | Netherlands | 357/38 |

*Primary Examiner*—Michael J. Lynch
*Assistant Examiner*—Joseph E. Clawson, Jr.
*Attorney, Agent, or Firm*—Sughrue, Rothwell, Mion, Zinn & Macpeak

[57] ABSTRACT

Power thyristor having rapid triggering, comprising a triggering emitter. On the cathode face, the separation line between an intermediate zone of the base and the main emitter, a line from which the firing of the thyristor is effected, has a symmetrical corrugated shape allowing an interdigitation which is also symmetrical. Application to the increasing of the triggering speed of power thyristors without any noticeable reduction in the maximum value of the intensity.

7 Claims, 4 Drawing Figures

POWER THYRISTOR HAVING A HIGH TRIGGERING SPEED

BACKGROUND OF THE INVENTION

1. Field of the Invention

The present invention concerns power thyristors having a high triggering speed.

2. Description of the Prior Art

It is known that these thyristors comprise:

A semi-conductor monocrystalline plate with an anode face and a cathode face, that plate comprising successively, from the anode face to the cathode face, an anode of the P type, an intermediate layer of the N type, a base of the P type and a layer of emitters of the N type having gaps taken up by the base, so that the cathode face comprises, at least, a central region of the base, a triggering emitter surrounding that central region, an intermediate region of the base surrounding that triggering emitter and a main emitter surrounding that intermediate region and having a greater area than the said triggering emitter;

A trigger formed by a metallic layer deposited on the said central region of the base at a distance from the said triggering emitter;

An "auxiliary" metal spray deposited on the said triggering emitter remaining at a distance from the said central region of the base and overlapping onto the said intermediate region of the base;

A cathode formed by a metallic layer deposited on the said main emitter at a distance from the said intermediate region of the base;

Two main terminals connected, the one to the said anode and the other to the said cathode;

A control terminal connected to the said trigger;

The function of the triggering emitter is also known: It is intended to make the firing easier by means of a low-power pulse:

The "triggering" emitter is distinct from the "main" emitter and has a smaller area. It is arranged between the trigger and the main emitter so that the thyristor being extinguished and under direct voltage between the anode and the cathode situated on the main emitter, the potential of the triggering emitter being floating, a suitable positive signal applied to the trigger fires firstly a triggering thyristor whose emitter is constituted by the triggering emitter.

To make the description more understandable, various more or less successive phases in the firing process may, very roughly, be distinguished:

First phase:

The signal applied to the trigger causes the injecting of minority carriers in the base from the triggering emitter.

Second phase:

The above injection fires the triggering thyristor according to the conventional process, this raising the potential of the triggering emitter.

Third phase:

The above-mentioned rise in potential draws a current from the triggering emitter towards the main cathode. That current will be called herebelow the "triggering current".

Fourth phase:

The triggering current causes the injecting of minority carriers in the base from the main emitter through the corresponding junction, which will be called hereinafter the "main junction".

Fifth phase:

The above injection fires the main thyristor according to the conventional process. This was the aim to be achieved, the advantage of the arrangement described being that the power available for injecting at the time of the above fourth phase is much greater than that which had been applied to the trigger.

The triggering emitter is separated from the main emitter by the base, in such a way that the current flowing from the triggering emitter to the main cathode passes through the base, this being favourable, at the time of the fourth phase, to the injecting through the main junction.

The cathode is recessed in relation to the edge of the main emitter, at least on the triggering emitter side, so as not to short-circuit the main junction at the time of the fourth phase. This obliges the triggering current to cross the main junction.

The auxiliary metal spray straddles the junction between the triggering emitter and the base on the main emitter side, so that at the time of the fourth phase, the triggering current does not have to cross that junction in the reverse direction, moreover, that metal spray makes it possible to distribute the potential of the triggering emitter. The doping profile and the width of the base are chosen to give a preferential value to the resistance between the triggering emitter and the main emitter.

The function of the triggering emitter is also to increase the triggering speed of the thyristor, that is, the speed of increase of the current which may be borne by the thyristor without destruction. It is known if the current increases too rapidly, it reaches high values before the surface of the thyristor which is effectively fired is sufficient to bear these values. It is therefore necessary to accelerate the speed of increase of the fired surface. That fired surface begins at the main junction and its original speed of increase is substantially proportional to the perimeter flush with that junction, that is, to the perimeter of the outer edge of the intermediate region of the aforementioned base.

To increase that perimeter, it is a known method, in the usual case of a circular semiconductor plate, to provide that intermediate region with extensions stretching radially towards the edge of the plate and to provide these extensions with lateral branches running along arcs of circles concentric with the plate. Such extensions attain at least half the width of the main emitter, that width being measured radially.

Thus, high triggering speeds are obtained, but the area of the main emitter is greatly decreased and the same applies to the maximum current which the thyristor can bear when it is completely fired.

The aim of the present invention is to make a high triggering speed of a thyristor compatible with a high value of maximum intensity which the thyristor can bear when it is completely fired.

SUMMARY OF THE INVENTION

It has for its object a power thyristor having a high triggering speed, of the type previously described, characterized in that the outside edge of the said intermediate region of the base has a corrugated shape, with hollow parts towards the said central region and protruding parts further away from that central region.

With reference to the accompanying diagrammatic FIGS. 1 to 4, various methods of implementing the invention will be described below by way of examples having no limiting character.

The equivalent elements shown in several of these figures are designated therein by the same reference numerals.

DESCRIPTION OF PREFERRED EMBODIMENTS

The thyristors whose semiconductor plate is shown in the figures comprise, evidently, besides that plate, a pressure contact box of a known type, which has not been shown.

Figure 1:
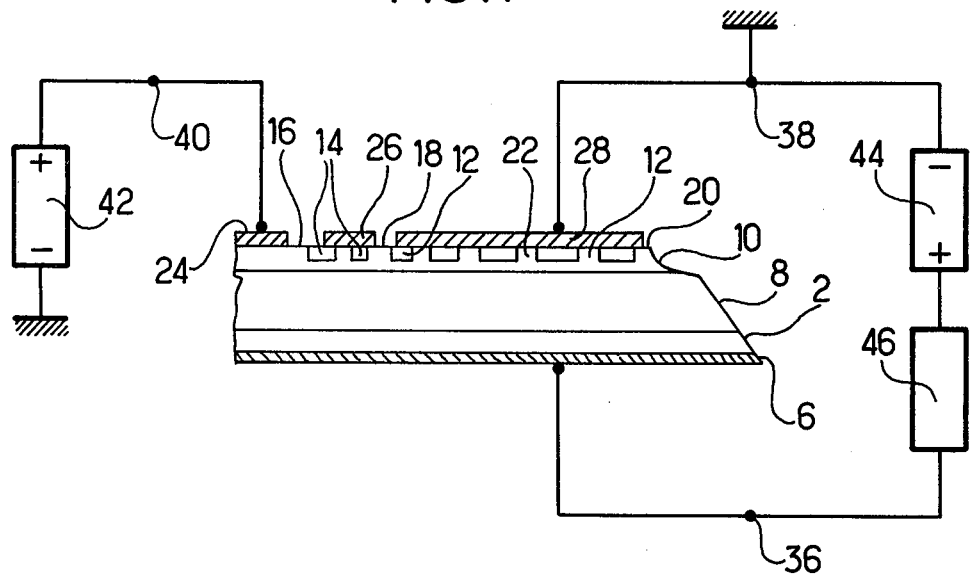
FIG. 1 is a cutaway view in a diametrical plane of the semiconductor plate of a thyristor according to the invention.
Figure 2:
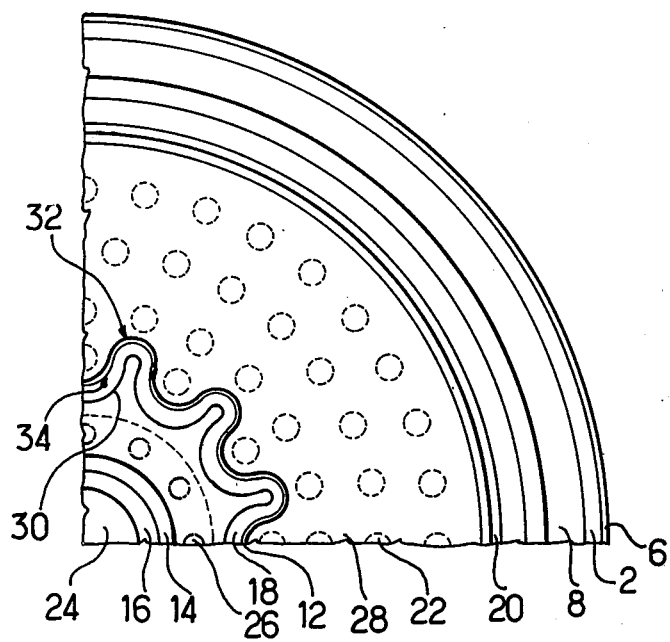
FIG. 2 is a bottom view of the plate in FIG. 1.

The plate shown in FIGS. 1 and 2 is circular and consists of monocrystalline silicon and its diameter is 16mm. It comprises, from top to bottom:

An anode 2 of the type having P conductivity with a degree of doping varying between $10^{14}$ and $10^{17}$ atoms per cubic centimeter, going from top to bottom and a thickness of 70 microns. The doping of its lower layer is of the $P^{++}$ type, that is, the degree of doping is between $10^{18}$ and $10^{20}$ atoms per cubic centimeter, approximately, through a thickness of 5 microns. Its lower face is covered with a metallic contact layer 6, made of aluminium, having a thickness of 30 microns;

An intermediate layer 8 of N type having slight doping, that is, $5.10^{13}$ atoms per cubic centimeter, having a thickness of 200 microns, approximately;

A base 10 of $P^+$ type having a thickness of 75 microns and, in certain regions, of 50 microns;

A layer of emitters of $N^{++}$ type, that is, whose degree of doping is in the order of $10^{20}$ atoms per cubic centimeter and a thickness of 25 microns.

That layer is separated by the base 10 into a main annular emitter 12 and a triggering annular emitter 14, surrounded, as seen from above, by the main emitter having a greater area. A central region 16 of the base is inside the main emitter, as seen from the top, an intermediate region 18 of the base being situated between the triggering emitter and the main emitter and a peripheral region 20 of the base being situated round the main emitter, these three regions having a thickness of 75 microns as previously mentioned, as well as a multitude of small circular regions such as 22 placed in the emitters and making it possible to produce, in a known manner, emitter short circuits (shunts) whose function is to avoid unseasonable triggering of the thyristor, at the time of the rapid increase phases of the direct voltage applied to the thyristor.

A discontinuous layer of aluminium having a thickness of 13 microns is deposited on certain parts of the upper face, or cathode face, of the semiconductor plate. That layer forms a trigger 24 on the central region 16 of the base, remaining at a distance of 0.4mm from the triggering emitter 14. It forms also an auxiliary metal spray 26 on the triggering emitter 14, remaining towards the inside, at a distance of 0.2mm from the region 16 and overlapping towards the outside on the intermediate region 18 of the base, to come up to a distance of 0.2mm from the main emitter 12. Lastly, it forms a cathode 28 on the main emitter assembly 12, stopping, towards the inside, at a slight distance, less than 0.1mm, from the intermediate region 18 and overlapping slightly outwards, on the peripheral region 20 of the base. The auxiliary metal spray 26 and the cathode 28 cover the emitter short circuits such as 22 so as to ensure an electrical contact with them and to enable them to fulfill their above-mentioned function.

According to the invention, the outside edge of the intermediate region 18 of the base has a corrugated shape, with hollow parts or valleys such as 30 lying towards the centre of the disk and protruding parts or peaks such as 32 extending towards the periphery. The number of these hollow parts, equal to that of these protruding parts, is 12 in the example described and that corrugated shape has a symmetry in the order of 12 about the centre of the disk, that is, it is identical to itself after a rotation of one twelfth of a turn. The number of the protruding parts such as 32 seems to be comprised, to great advantage, between 8 and 18. The height of the protruding parts in relation to the hollow parts, measured radially, is in the order of 10 percent of the width of the main emitter 12 measured in the same direction. It seems that it should remain, according to the performances required of the thyristor, between 5 and 20 percent of that width. It also seems that the curvature radius of the protruding parts is, to great advantage, less than that of the hollow parts, it being understood that the said outside edge maintains, to great advantage, rounded shapes. In practice, a simple shape is that of a succession of arcs of circles, which are approximately semi-circles, open alternately inwards in the protruding parts and outwards in the hollow parts, with a diameter in the hollow parts of 1mm, for example, less than twice the diameter in the protruding parts, 0.7mm, for example. To remain at a distance of 0.2mm from the edge of the main emitter 12, the auxiliary metal spray 26 is in the shape of fingers such as 34 engaging in the protruding parts such as 32. The resistance between the main emitter and the triggering emitter is chosen equal to 4ohms.

The main terminals 36 and 38 of the thyristor are connected, through pressed metallic contact elements of known type, not shown, one at the anode 6, the other at the cathode 28, between which a reverse tension of 1200 volts and a direct tension of 1200 volts may be set up, without breakdown. In the case of a direct tension, a positive pulse of 3 volts lasting at least 5 microseconds, applied to a control terminal 40 connected to the trigger 24, enables the firing of the thyristor whose maximum intensity is 200A. A control generator is shown at 42, a feed source 44 providing the current which is to cross a charge 46 thereby being controlled by the thyristor. The shape chosen, according to the invention, for the outside edge of the intermediate region 18 makes it possible to make the current increase at a speed of 1,100 amperes per microsecond, whereas the maximum increase speed of the current is only 800 amperes per microsecond, in similar conditions, if the outside edge of the region 18 is circular, the maximum intensity being practically unchanged.

Figure 3:
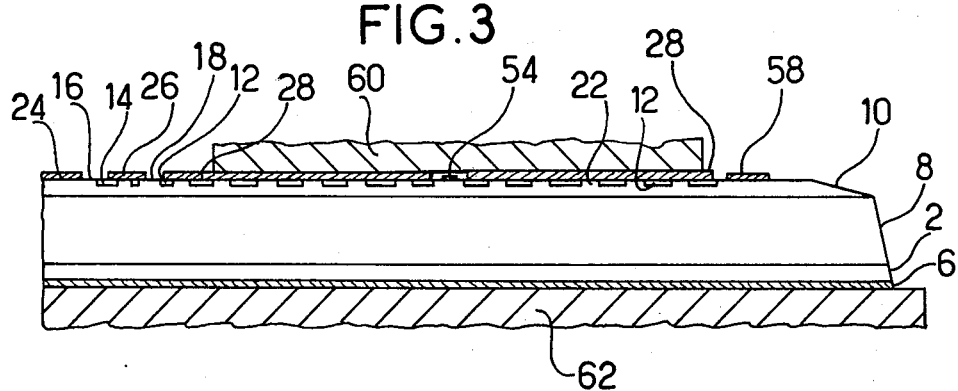
FIG. 3 is a cutaway view in a diametrical plane of the semiconductor plate of another thyristor according to the invention.
Figure 4:
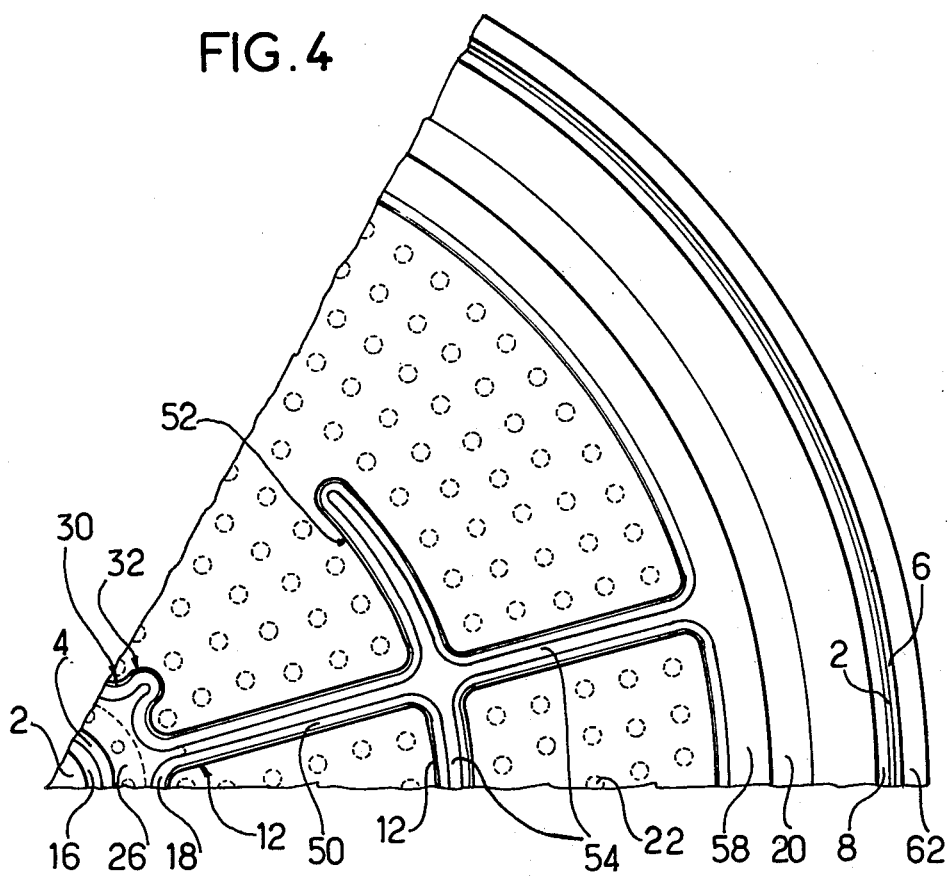
FIG. 4 is a top view of the plate in FIG. 3.

The semiconductor plate shown in FIGS. 3 and 4 is similar to that shown in FIGS. 1 and 2. It differs therefrom in the following points: Its diameter is larger: 36mm, so as to impart a greater value (550A) to the maximum intensity liable to be carried by the thyristor. The result of this is that the total duration of the firing of the thyristor by progressive increase of the fired zone from the outside edge of the intermediate zone 18 of the base would be greatly increased if that outside edge maintained its shape and its dimensions. That is why, according to an arrangement known per se, that outside edge has fingers such as 50 arranged radially and forming lateral branches such as 52 in the shape of arcs of circles concentric with the disk, at half the width of the main emitter. These fingers are connected, on the outside, to a peripheral part 20 of the base. In the axis of these fingers and branches having a width of 0.7mm, the auxiliary metal spray 26 enters, with a width of 0.3mm in the shape of strips of aluminium such as 54 in the fingers and 56 in the branches, being connected to a circular strip 58 on the peripheral part 20 of the base. The function of these strips is to transmit, in the fingers and branches such as 50 and 52 and the peripheral part 20, the variations in the potential of the triggering emitter 14 so as to enable the firing of the thyristor from these fingers, branches and peripheral part. The thickness of these metallic branches such as 54 is slighter than that of the cathode 28, so as to avoid an electrical contact between these strips and a metallic contact element 60 pressed against the cathode 28 to ensure its connection to a main terminal of the thyristor, the other metallic contact element being shown at 62.

The fingers such as 50 take the place of one of the protruding parts such as 32 out of two, this resulting, for the plate as a whole, in a symmetry in the order of 6 about its centre. In a more general way, the number of hollow parts such as 30 is, to great advantage, the product of two whole numbers such as 2 and 6 or 3 and 4 and the number of fingers replacing protruding parts is one of these two whole numbers, so as to maintain symmetry about the centre of the plate.

It should be observed that the implementing of the invention has no influence on the process of firing the thyristor from the fingers and branches such as 50 and 52. It only has the effect of accelerating the firing process in the part of the main emitter which is the most central, without noticeably affecting the value of the maximum intensity which can be borne by the thyristor, whereas the existence of the fingers and branches such as 50 and 52, necessary for accelerating the firing in the other parts of the main emitter according to a known arrangment, is accompanied by a noticeable reduction of that maximum intensity.

I claim:

1. In a power thyristor having a high triggering speed, said thyristor comprising:
   a semi-conductor monocrystalline plate with an anode face and a cathode face, said plate comprising successively, from the anode face to the cathode face, an anode of the P type, an intermediate layer of the N type, a base of the P type and a layer of emitters of the N type having gaps taken up by the base, so that the cathode face comprises, at least, a central region of the base, a triggering emitter surrounding that central region, an intermediate region of the base surrounding that triggering emitter and a main emitter surrounding that intermediate region and having a greater area than said triggering emitter;
   a trigger formed by a metallic layer deposited on said central region of the base at a distance from said triggering emitter;
   an auxiliary metal spray deposited on said triggering emitter spaced at a distance from said central region of the base and overlapping onto said intermediate region of the base;
   a cathode formed by a metallic layer deposited on said main emitter at a distance from said intermediate region of the base;
   two main terminals, one connected to said anode and the other connected to said cathode;
   a control terminal connected to said trigger; the improvement comprising:
   the outside edge of said intermediate region of the base having a corrugated shape, with valleys extending radially towards said central region and peaks extending radially away from that central region, and wherein the height of said peaks in relation to said valleys, measured radially from said central region, is between 20 percent and 5 percent of the width of said main emitter, measured in the same direction.

2. The thyristor according to claim 1, wherein: the curvature radius of said outside edge of the intermediate region is less on the said peaks than in said valleys.

3. The thyristor according to claim 2, wherein: said edge is substantially constituted by a succession of semi-circles open alternately inwards in the peaks and outwards in the valleys.

4. The thyristor according to claim 3, wherein: the diameter of said semi-circles in the valleys is less than twice the diameter of said semi-circles in the peaks.

5. The thyristor according to claim 1, wherein: the number of said peaks is between 8 and 18.

6. The thyristor according to claim 1, wherein: said auxiliary metal spray has fingers entering said peaks.

7. The thyristor according to claim 6, wherein: said semiconductor disk is substantially circular and said intermediate region between the base and the auxiliary metal spray has a shape which is identical to itself after a rotation by a whole fraction of a turn about the center of said disk.

* * * * *